(12) United States Patent
Shibata

(10) Patent No.: US 7,981,713 B2
(45) Date of Patent: *Jul. 19, 2011

(54) GROUP III-V NITRIDE-BASED SEMICONDUCTOR SUBSTRATE, GROUP III-V NITRIDE-BASED DEVICE AND METHOD OF FABRICATING THE SAME

(75) Inventor: Masatomo Shibata, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/332,876

(22) Filed: Dec. 11, 2008

(65) Prior Publication Data

US 2009/0098677 A1 Apr. 16, 2009

Related U.S. Application Data

(62) Division of application No. 11/508,884, filed on Aug. 24, 2006, now abandoned.

(30) Foreign Application Priority Data

Mar. 15, 2006 (JP) ................... 2006-071723

(51) Int. Cl.
*H01L 21/20* (2006.01)

(52) U.S. Cl. .................. 438/47; 257/E21.09

(58) Field of Classification Search ............ 438/47; 257/E21.09
See application file for complete search history.

(56) References Cited

U.S. PATENT DOCUMENTS

| | | |
|---|---|---|
| 6,413,627 B1 | 7/2002 | Motoki et al. |
| 6,667,184 B2 | 12/2003 | Motoki et al. |
| 6,831,293 B2 | 12/2004 | Udagawa |
| 6,924,159 B2 | 8/2005 | Usui et al. |
| 7,030,428 B2 | 4/2006 | Saxler |
| 7,271,404 B2 | 9/2007 | Oshima et al. |
| 2001/0048114 A1 | 12/2001 | Morita et al. |
| 2003/0033974 A1 | 2/2003 | Ueda |
| 2004/0137657 A1 | 7/2004 | Dmitriev et al. |
| 2004/0183090 A1 | 9/2004 | Kitaoka et al. |
| 2005/0023544 A1* | 2/2005 | Shibata .................. 257/94 |
| 2006/0228870 A1 | 10/2006 | Oshima |

FOREIGN PATENT DOCUMENTS

| | | |
|---|---|---|
| JP | 4-297023 A | 10/1992 |
| JP | 10-312971 A | 11/1998 |
| JP | 11-251253 A | 9/1999 |
| JP | 2000-012900 A | 1/2000 |
| JP | 2000-22212 A | 1/2000 |

(Continued)

OTHER PUBLICATIONS

Akira Usui et al., "Thick GaN Epitaxial Growth with Low Dislocation Density by Hydride Vapor Phase Epitaxy", Jpn. J. Appl. Phys. vol. 36 (1997), pp. L899-902.

(Continued)

*Primary Examiner* — Matthew Smith
*Assistant Examiner* — Walter H Swanson
(74) *Attorney, Agent, or Firm* — Foley & Lardner LLP

(57) ABSTRACT

A group III-V nitride-based semiconductor substrate has: a first layer made of GaN single crystal; and a second layer formed on the first layer, the second layer made of group III-V nitride-based semiconductor single crystal represented by $Al_xGa_{1-x}N$, where $0.9 < x \leq 1$, wherein a top surface and a back surface of the substrate are flattened.

2 Claims, 7 Drawing Sheets

FOREIGN PATENT DOCUMENTS

| | | |
|---|---|---|
| JP | 2003-165799 A | 6/2003 |
| JP | 2003-178984 A | 6/2003 |
| JP | 2005-191306 A | 7/2005 |
| JP | 2005-277015 A | 10/2005 |

OTHER PUBLICATIONS

Kensaku Motoki et al., "Preparation of Large Freestanding GaN Substrates by Hydride Vapor Phase Epitaxy Using GaAs as a Starting Substrate", Jpn. J. Appl. Phys. vol. 40(2001) pp. L140-L143.

Andrey Nikolaev et al., "AlN Wafers Fabricated by Hydride Vapor Phase Epitaxy", MRS Internet J. Nitride Semicond. Res. vol. 5S1 Published 2000, W6.5.

Y. Kumagai et al., "Hydride vapor phase epitaxy of AlN: thermodynamic analysis of aluminum source and its application to growth", Phys. Stat. Sol. (c), vol. 0, No. 7, 2003, pp. 2498-2501.

Ok-Hyun Nam et al.., "Lateral epitaxy of low defect density GaN layers via organometallic vapor phase epitaxy", Appl. Phys. Lett., vol. 71, No. 18 (1997), pp. 2638-2640.

Masaru Kuramoto et al., "Room-Temperature Continuous-Wave Operation of InGaN Multi-Quantum-Well Laser Diodes Grown on an n-GaN Substrate with a Backside n-Contact", Jpn. J. Appl. Phys., vol. 38, Part 2, No. 2B (1999), pp. L184-L186.

Tsvetanka S. Zheleva et al.., „Pendeo-Epitaxy—A new approach for lateral growth of gallium nitride structures, MRS Internet J. Nitride Semicond. Res. 4S1, G3.38 (1999), 6 pgs.

Yuichi Oshima et al., "Preparation of Freestanding GaN Wafers by Hydride Vapor Phase Epitaxy with Void-Assisted Separation", Jpn. J. Appl. Phys., vol. 42, Part 2, No. 1A/B (2003), pp. L1-L3.

* cited by examiner

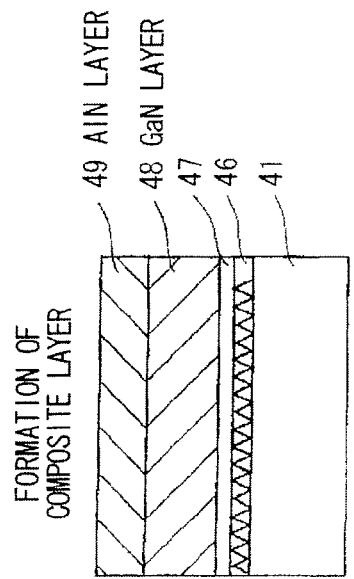
FIG. 4D
FORMATION OF COMPOSITE LAYER
49 AlN LAYER
48 GaN LAYER
47
46
41
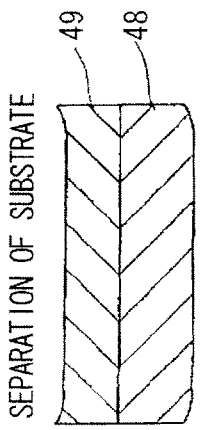
FIG. 4E
SEPARATION OF SUBSTRATE
49
48
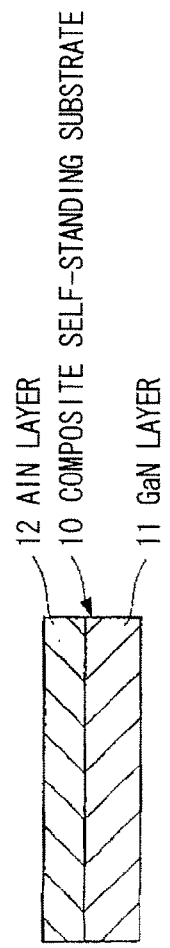
FIG. 4F
FLATTENING OF BOTH SURFACES
12 AlN LAYER
10 COMPOSITE SELF-STANDING SUBSTRATE
11 GaN LAYER
FIG. 4A
FORMATION OF Si-DOPED GaN LAYER
43 Si-DOPED GaN LAYER
41 SAPPHIRE SUBSTRATE
FIG. 4B
FORMATION OF Ti FILM
45 Ti FILM
43
41
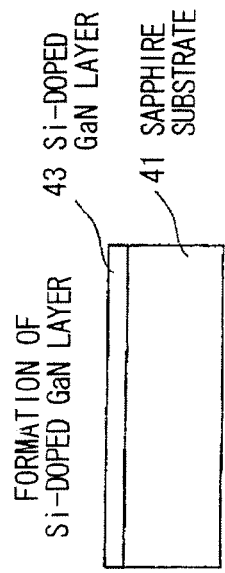
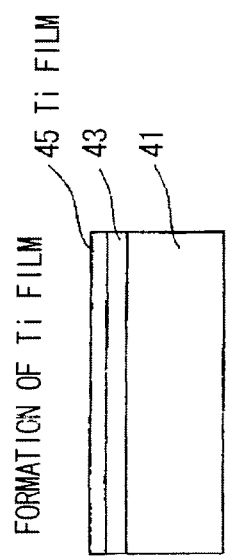
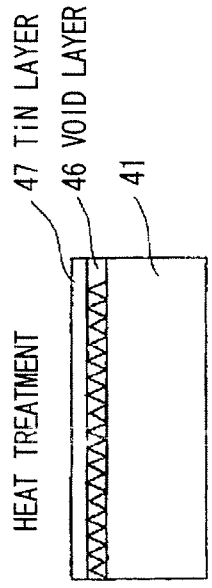
FIG. 4C
HEAT TREATMENT
47 TiN LAYER
46 VOID LAYER
41

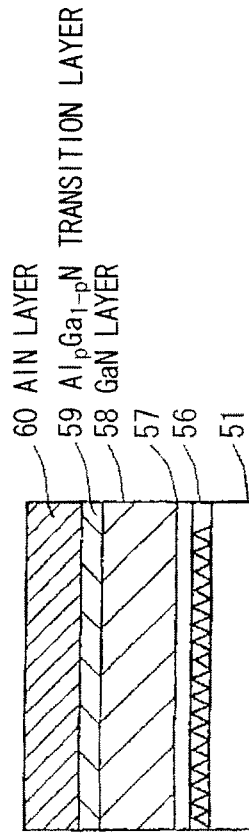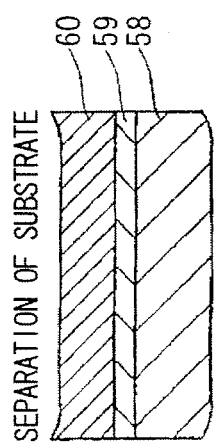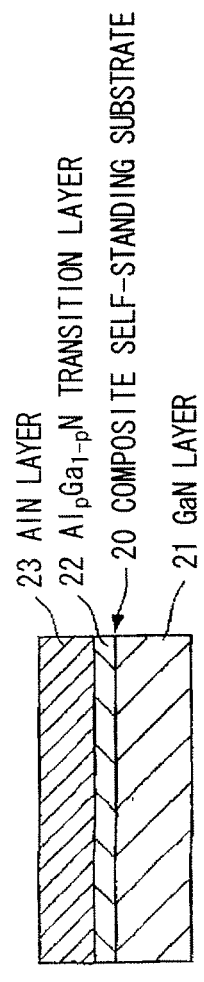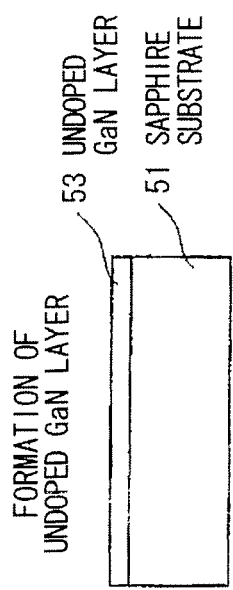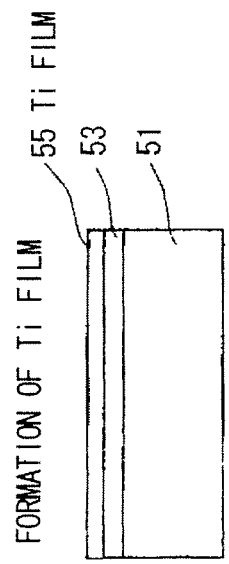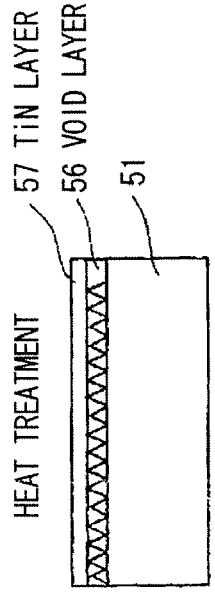

GROUP III-V NITRIDE-BASED SEMICONDUCTOR SUBSTRATE, GROUP III-V NITRIDE-BASED DEVICE AND METHOD OF FABRICATING THE SAME

CROSS REFERENCE TO RELATED APPLICATIONS

The present application is a Divisional of U.S. application Ser. No. 11/508,884, filed Aug. 24, 2006, which is based upon and claims the benefit of priority from the prior Japanese patent application No. 2006-071723, filed Mar. 15, 2006, the entire contents of which are incorporated herein by reference.

BACKGROUND OF THE INVENTION

1. Field of the Invention

This invention relates to a group III-V nitride-based semiconductor substrate, a group III-V nitride-based device and a method of fabricating the same. In particular, this invention relates to a group III-V nitride-based semiconductor substrate having a high-quality AlN layer with a good crystalline quality or a similar layer with a high thermal conductivity formed on its surface, a high-output group III-V nitride-based device with the same substrate to provide an excellent heat radiation property, and a method of fabricating the substrate or the device with a good reproducibility and at a low cost.

2. Description of the Related Art

Group III-V nitride-based compound semiconductors such as gallium nitride (GaN), indium gallium nitride (InGaN) and aluminum gallium nitride (GaAlN) are used to fabricate a short-wavelength light emitting device, especially, blue light emitting diode (LED) since they have a wide bandgap and are of direct transition type in interband transition. Recently, a ultraviolet LED with a further short wavelength and a white LED with a phosphor combined with such an LED are in practical use. Furthermore, the group III-V nitride-based compound semiconductors have applied to electronic devices and power devices since they have a good heat resistance and environment resistance.

In fabricating a semiconductor device, an underlying substrate is generally used which has the same lattice constant or linear expansion coefficient as a crystal to be grown on the substrate, so as to conduct the homo-epitaxial growth. For example, a GaAs single crystal substrate is used to conduct the epitaxial growth of GaAs, AlGaAs.

However, for group III-V nitride-based semiconductor crystals, no group III-V nitride-based semiconductor substrate with a practical size and characteristics has been obtained thus far. Therefore, most of nitride-based LED's developed are fabricated by using the hetero-epitaxial growth where group III-V nitride-based semiconductor crystals are grown on a sapphire substrate with a near lattice constant by MOVPE (metalorganic vapor phase epitaxy). Many problems arise from the hetero-growth.

For example, due to the difference in linear expansion coefficient between the sapphire substrate and GaN, a problem has occurred that the substrate after the epitaxial growth is warped significantly. This causes a reduction in yield since the substrate may crack during the photolithography or chip fabrication process after the epitaxial growth.

Further, since the lattice constant of the sapphire substrate is different from the GaN, a buffer layer needs to be deposited thereon at lower temperature than the proper crystal growth temperature before growing the nitride single crystal. This is a factor to increase the time required for the crystal growth. Furthermore, in case of the growth on the sapphire substrate, dislocations are generated as many as $10^8$ to $10^9/cm^{-2}$ in the GaN epi-layer due to the difference in lattice constant between the sapphire substrate and the GaN. The dislocation is a factor to lower the output and reliability of LED. Although in the conventional blue LED's the dislocation is not so much questioned, the influence of the dislocation on the device characteristics is assumed to increase hereafter according as the output of LED is further increased or as the emission wavelength thereof is shortened to develop the ultraviolet LED. Therefore, some measure is needed to reduce the dislocation.

In order to solve these problems, a self-standing substrate of GaN single crystal has been developed in recent years. The GaN self-standing substrate is produced by, e.g., ELO (epitaxial lateral overgrowth), where a mask with openings is formed on the underlying substrate (=sapphire substrate), and then the lateral growth is conducted through the openings to obtain GaN with a reduced dislocation, and after forming the GaN layer on the sapphire substrate, the sapphire substrate is removed by etching to obtain the GaN self-standing substrate (e.g., JP-A-11-251253).

As a progress of the ELO, FIELO (facet-initiated epitaxial lateral overgrowth) has been developed (e.g., Akira Usui et al., "Thick GaN Epitaxial Growth with Low Dislocation Density by Hydride Vapor Phase Epitaxy", Jpn. J. Appl. Phys. Vol. 36 (1997), pp. L899-902). The FIELO is in common with the ELO on the point that the selective growth is conducted by using the silicon dioxide mask, but it is different from the ELO on the point that a facet is formed at the mask opening during the selective growth. By forming the facet, the propagation direction of dislocation is changed so that the threading dislocation reaching the top surface of the epitaxial growth layer can be reduced. When a thick GaN layer is grown by using the FIELO on an underlying substrate such as sapphire and then the underlying substrate is removed, the GaN self-standing substrate with relatively few defects can be obtained.

The other methods for obtaining a low-dislocation GaN self-standing substrate include DEEP (Dislocation Elimination by the Epi-growth with inverted-Pyramidal pits: e.g., Kensaku Motoki et al., "Preparation of Large Freestanding GaN Substrates by Hydride Vapor Phase Epitaxy Using GaAs as a Starting Substrate", Jpn. J. Appl. Phys. Vol. 40 (2001) pp. L140-L143, and JP-A-2003-165799). The DEEP is conducted such that GaN is grown on a GaAs substrate, which is removable by etching, by using a SiN patterning mask while intentionally forming pits surrounded by facets on the surface of crystal, accumulating dislocations at the bottom of pits to allow regions other than pits to have a low dislocation density.

Further, the other methods for obtaining a low-dislocation GaN self-standing substrate include the method that a GaN layer is formed on a sapphire C-face ((0001) facet) substrate, a titanium film is formed thereon, the substrate is then subjected to heat treatment in an atmosphere of hydrogen gas or hydrogen-containing compound gas to form voids in the GaN layer, and a GaN semiconductor layer is formed on the GaN layer e.g., JP-A-2003-178984).

The GaN self-standing substrate obtained by using the ELO or DEEP etc., where the GaN film is grown on the hetero-substrate by HVPE and then the GaN layer is separated from the underlying substrate, is used mainly for the development of laser diode (LD) which requires especially a low-dislocation crystal. However, recently, it is also used for the LED substrate.

The GaN substrate has a high thermal conductivity of 1.98 W/(cm·k) as compared to that (0.42 W/(cm·k)) of the conventional sapphire substrate. Since the heat radiation efficiency is thus enhanced, the development of a high-output light emitting device or power device with a large heat generation has been accelerated.

According to this trend, the next demand is directed to a self-standing substrate of AlN which has a higher thermal conductivity (3.2 W/(cm·k) in theoretical value) than the GaN. Thus, the growth of Al-containing group III-V nitride-based semiconductor crystal has been researched by using HVPE which is employed to grow the GaN substrate (e.g., Andrey Nikolaev et al., "AlN Wafers Fabricated by Hydride Vapor Phase Epitaxy", MRS Internet J. Nitride Semicond. Res. Volume 5S1 Published 2000, W6.5., and Y. Kumagai et al., "Hydride vapor phase epitaxy of AlN: the rmodynamic analysis of aluminum source and its application to growth", Phys. Stat. Sol. (c), Vol. 0, No. 7, 2003, pp. 2498-2501).

Further, a GaN stacked substrate is known in which a Si—$Al_{0.05}Ga_{0.95}N$ layer is grown about 10 μm on a GaN substrate (JP-A-2005-191306), and an AlGaN-based composite substrate is known in which an $Al_{0.15}Ga_{0.85}N$ upper substrate is grown 300 to 400 μm on a GaN lower substrate (JP-A-2005-277015).

However, when the AlN is grown by HVPE as disclosed in Andrey Nikolaev et al. and Y. Kumagai et al., aluminum chloride as a raw material may react with a quartz member composing the reactor depending on the grow conditions to corrode the member. Thus, when a thick film of AlN is needed to grow, the quartz member will be corroded so much. Therefore, the quartz member needs to be replaced frequently, the manufacturing cost will be increased, and the quartz member may be broken during the crystal growth.

In addition, since a bulk of AlN is difficult to grow, the technique for producing a high-quality AlN substrate with a good reproducibility is not realized at present.

On the other hand, when the AlGaN is in a separate process formed on the GaN substrate made previously as disclosed in JP-A-2005-191306 and JP-A-2005-277015, native oxide film will be generated since the GaN substrate is once exposed into the air, or the growth surface may be not clean due to a contamination during the handling. Further, since the GaN surface is subjected to a rising and falling temperature cycle, it may be denatured by heat. As a result, a layer containing many defects may be generated at the GaN/AlGaN interface, and a number of cracks may be generated in the AlGaN crystal layer.

SUMMARY OF THE INVENTION

It is an object of the invention to provide a group III-V nitride-based semiconductor substrate that has a high-quality AlN layer with a good crystalline quality or a similar layer with a high thermal conductivity formed on its surface, a high-output group III-V nitride-based device with the same substrate to provide an excellent heat radiation property, and a method of fabricating the substrate or the device with a good reproducibility and at a low cost.

The inventor has found that, by using the conventional method of producing a high-quality GaN single-crystal substrate, GaN and AlN are continuously grown in the same reactor to produce a composite substrate, forming a device structure thereon, and removing the GaN layer by backlapping the bottom layer of the composite substrate to reach the AlN layer, whereby the same device characteristics as a device that could be formed on an AlN substrate with a good crystalline quality can be obtained. The invention is invented based on the finding.

(1) According to one aspect of the invention, a group III-V nitride-based semiconductor substrate comprises:

a first layer comprising GaN single crystal; and a second layer formed on the first layer, the second layer comprising group III-V nitride-based semiconductor single crystal represented by $Al_xGa_{1-x}N$, where $0.9<x\leq1$, wherein a top surface and a back surface of the substrate are flattened.

In the above invention (1), the following modifications and changes can be made.

(i) The group III-V nitride-based semiconductor substrate further comprises a transition layer formed between the first layer and the second layer, the transition layer comprising a composition that changes continuously from GaN to $Al_xGa_{1-x}N$, where $0.9<x\leq1$.

(ii) The substrate is in circular form with a diameter of 50 mm or more and a thickness of 200 μm or more.

(iii) The substrate comprises a dislocation density of $1\times10^8$ $cm^{-2}$ or less on its surface.

(iv) The second layer comprises a thickness of 50 μm or more.

(v) The substrate comprises a self-standing substrate.

(2) According to another aspect of the invention, a group III-V nitride-based device comprises:

a layer comprising a group III-V nitride-based semiconductor single crystal represented by $Al_xGa_{1-x}N$, where $0.9<x\leq1$, the crystal comprising a dislocation density of $1\times10^8$ $cm^{-2}$ or less; and a device structure formed on the layer, wherein the device structure comprises a group III-V nitride-based semiconductor single crystal represented by $In_yGa_zAl_{1-y-z}N$, where $0\leq y\leq1$, $0\leq z\leq1$ and $0\leq y+z\leq1$.

(3) According to another aspect of the invention, a method of making a group III-V nitride-based semiconductor substrate comprises the steps of:

growing a group III-V nitride-based semiconductor film on a hetero-substrate and then depositing a metal film thereon;

heating the hetero-substrate with the metal film in an atmosphere containing hydrogen gas or hydride gas to form a void in the group III-V nitride-based semiconductor film;

growing a first layer comprising a GaN single crystal thereon;

further growing thereon a second layer comprising a group III-V nitride-based semiconductor single crystal represented by $Al_xGa_{1-x}N$, where $0.9<x\leq1$;

removing the hetero-substrate while leaving the first layer and the second layer to provide the group III-V nitride-based semiconductor substrate; and flattening a top surface and a back surface of the substrate.

In the above invention (3), the following modifications and changes can be made.

(vi) The first layer and the second layer are continuously grown in a same reactor.

(vii) The first layer and the second layer are grown by HVPE.

(4) According to another aspect of the invention, a method of making a group III-V nitride-based device comprises the steps of:

forming a device structure comprising an epitaxial growth layer on the group III-V nitride-based semiconductor substrate as defined in (1); and flattening a back surface of the substrate to remove the first layer to render the second layer exposed, wherein the group III-V nitride-based device is formed such that the device structure is formed on the second layer.

ADVANTAGES OF THE INVENTION

The group III-V nitride-based semiconductor substrate of the invention comprises a $Al_xGa_{1-x}N$ layer, where $0.9<x\leqq1$. Thus, after forming a device structure on the substrate, the bottom layer of the substrate is backlapped until reaching the $Al_xGa_{1-x}N$ layer, whereby the same device characteristics as a device that could be formed on an AlN substrate with a good crystalline quality can be obtained.

Furthermore, since the $Al_xGa_{1-x}N$ layer is excellent in heat radiation property, the group III-V nitride-based semiconductor substrate of the invention can be suitably applied to high-output light emitting devices and power devices.

By using the methods of the invention, the group III-V nitride-based semiconductor substrate or group III-V nitride-based device can be fabricated with a good reproducibility and at a low cost.

BRIEF DESCRIPTION OF THE DRAWINGS

The preferred embodiments according to the invention will be explained below referring to the drawings, wherein:

FIGS. 4A to 4F are schematic cross sectional views showing a method of making a composite self-standing substrate in Example 1 according to the invention;

FIGS. 5A to 5F are schematic cross sectional views showing a method of making a composite self-standing substrate in Example 2 according to the invention;

DETAILED DESCRIPTION OF THE PREFERRED EMBODIMENTS

Figure 1:
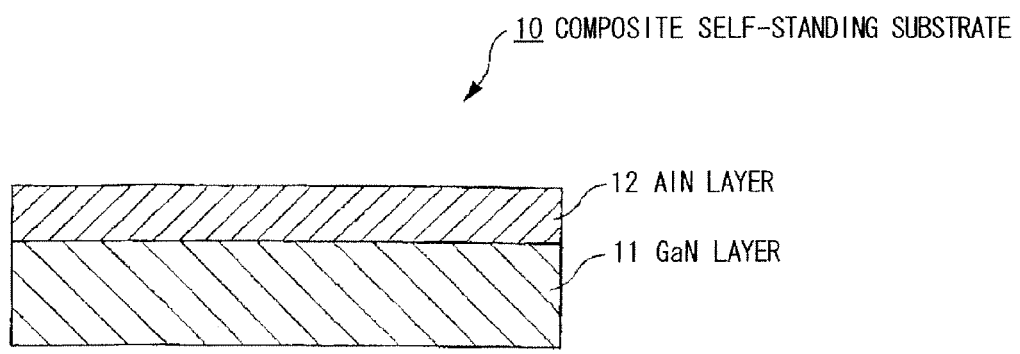
FIG. 1 is a cross sectional view showing a composite self-standing substrate in a preferred embodiment according to the invention.

FIG. 1 is a cross sectional view showing a composite self-standing substrate in the preferred embodiment according to the invention.

The composite self-standing substrate 10 comprises a GaN layer 11 and an AlN layer 12 formed on the GaN layer 11. The surface of the AlN layer 12 and the back surface of the GaN layer 11 are flattened by lapping, polishing, grinding etc. A light emitting device is fabricated by forming a device structure on the composite self-standing substrate 10, then by removing the GaN layer 11 by backlapping from the back surface of the GaN layer 11 until reaching the AlN layer 12.

Self-Standing Substrate

Herein, a self-standing substrate means a substrate that is capable of holding its shape by itself and has a sufficient strength for handling. To provide such a strength, the thickness of self-standing substrate is preferably 200 μm or more.

Size of Substrate

The GaN self-standing substrate of the embodiment has a circular form with a diameter of 50 mm or more and preferably a thickness of 200 μm or more. Light emitting devices, especially, LED's are a versatile device used for civilian goods, and, therefore, they need to satisfy a mass productivity so that they can be practically used and prevailed. If the substrate has a diameter greater than 50 mm, it can be easy applied to the mass production process since a mass-production processing apparatus has been already developed for GaAs substrates. The reason why the substrate needs a thickness greater than 200 μm is that, if less than 200 μm in thickness, the substrate may crack frequently when being handled by a pin set etc.

GaN Layer

The GaN layer 11 is used as a lower layer of the composite self-standing substrate 10 since it can be easy epitaxially grown and it can be easy crystallized with a large diameter and a thick thickness. It is desired that the GaN layer 11 has a group III facet in (0001) direction on the surface. This is because the group III nitride-based crystal has a strong polarity and its group III facet is more stable than its group V facet (=nitrogen facet) in chemical and thermal aspects.

Formation of AlN Layer

It is desired that the AlN layer 12 is grown continuously in the same reactor as the underlying GaN layer 11. This is not only because the time required for the growth can be shortened, but also because the generation of oxide film between the GaN layer 11 and the AlN layer 12 can be prevented, so that the generation of defects in the AlN layer 12 can be suppressed as well as the generation of an electrical barrier layer therebetween. A transition layer with a composition varying continuously may be between the GaN layer and the AlN layer.

Figure 2:
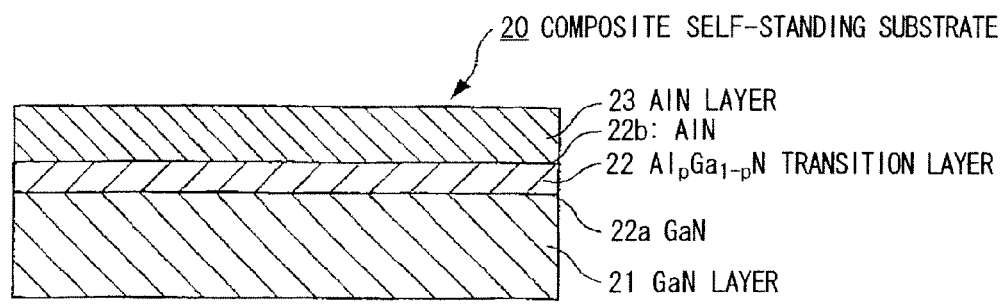
FIG. 2 is a cross sectional view showing a composite self-standing substrate in another preferred embodiment according to the invention.

FIG. 2 shows a composite self-standing substrate in another embodiment of the invention, which is provided with the transition layer. As shown, the composite self-standing substrate 20 has the $Al_pGa_{1-p}N$ transition layer 22, in which p varies gradually from 0 to 1, with compositions continuously varying from GaN 22a to AlN 22b between the GaN layer 21 and the AlN layer 23. In the composite self-standing substrates 10, 20 as shown in FIGS. 1 and 2, the conductivity type of the AlN layer should be controlled suitably according to the target device, and is not to be determined uniformly.

Thickness of AlN Layer

The characteristics required for the composite self-standing substrate are that it has a small thermal resistivity sufficient to radiate heat from the device formed thereon through there to the outside, that it has strength sufficient to prevent from cracking when being handled in the epitaxial growth process for forming a device structure or in the subsequent semiconductor fabrication process. Because of this, the substrate thickness needs to be 200 μm or more. However, when the device is used practically, the substrate is removed by backlapping at the back surface and is finally provided with only a thickness of about 100 μm left. Thus, a factor to determine the heat radiation property of the device is a thermal resistivity of about 100 μm thick crystal near the surface of the substrate, and a region under there is sufficient if it functions as a base during the operation. Therefore, it is desired that the AlN layer 12 (or 23) has a final thickness of 50 μm or more. This thickness is needed to keep the strength of the device chip after removing the GaN layer 11 (or 21) by backlapping. Since it is difficult to selectively remove only the GaN layer 11 (or 21) by the backlapping, the AlN layer 12 (or 23) must be also removed by 10 to 20 μm. Thus, if the AlN layer 12 (or 23) formed is less than 50 μm in thickness, the AlN layer 12 (or 23) of the real device must be less than 30 μm in thickness. Therefore, when the chip is mounted or wire-bonded, the chip may crack frequently.

Composition of AlN Layer

Instead of the AlN layer 12 (or 23), an AlGaN layer may be used which has a composition by which the thermal conductivity is not reduced significantly. For example, $Al_xGa_{1-x}N$ ($0.9 < x = \leq 1$) including AlN can be used. The Al composition is set to be greater than 0.9. This is because, if the Ga composition is greater than 0.1 while the Al composition is less than 0.9, the thermal conductivity is significantly reduced to $\frac{1}{10}$ of the AlN so that the heat radiation property will deteriorate.

Surface of AlN Layer

In general, there are many large uneven parts such as hillocks or microscopic uneven parts which are assumed to be generated by step bunching, on the surface of the as-grown AlN layer 12 (or 23). Thus, the surface is flattened by polishing, lapping, grinding etc. The flattening is intended not only to remove factors to render uneven the morphology, thickness, composition of an epi-layer grown thereon, but also to improve the device production yield without reducing the processing precision of photolithography in the device fabrication process.

Back Surface of AlN Layer

The back surface of the GaN layer 11 (or 21) at the bottom of the composite self-standing substrate 10 (or 20) is also flattened by polishing, lapping, grinding etc. The flattening of the back surface is intended to improve the contact between the substrate and the susceptor when growing the epi-layer on the substrate. If the back surface of the substrate is not in uniform contact with the susceptor, the thermal conduction from the susceptor becomes uneven and, thereby, the in-plane substrate temperature during the epi-growth will be uneven. Since the in-plane unevenness of the substrate temperature causes unevenness in the crystal growth rate, composition and impurity concentration, the epi-layer with in-plane uniform characteristics cannot be obtained. Although apparatuses for the epi-growth include a face-down type in which the back surface of the substrate is not in contact with the susceptor, even the face-down type uses generally a flat plate called uniform heating plate disposed on the back surface of the substrate. If distance between the back surface of the substrate and the uniform heating plate is uneven, the unevenness in temperature will be generated which causes the unevenness in device characteristics. The back surface only has to be flattened such that it is in close contact with the susceptor during the epi-growth. Therefore, it does not always have to be mirror-finished. For example, it can be a lapped surface, a ground surface or the lapped or ground surface being treated by etching etc. to remove a strain.

Dislocation Density of Substrate

It is desired that the dislocation density at the surface of the substrate is less than $1 \times 10^8$ $cm^{-2}$. It is known that the dislocation from the substrate is propagated into the epitaxial growth layer grown on the substrate. The dislocation of the epi-layer exceeding the above dislocation density will degrade the device characteristics to lower the reliability.

Method of Making the Composite Self-Standing Substrate

The composite self-standing substrate of the embodiment can be obtained by growing the GaN layer and the AlN layer single crystals on the hetero-substrate, and then removing the hetero-substrate by separation. The GaN layer and the AlN layer single crystals are desirably grown by HVPE (hydride vapor phase epitaxy). This is because the HVPE is high in crystal growth rate so that it is suitable for the substrate fabrication in which a thick film is needed to grow.

Structure of HVPE Reactor

Figure 3:
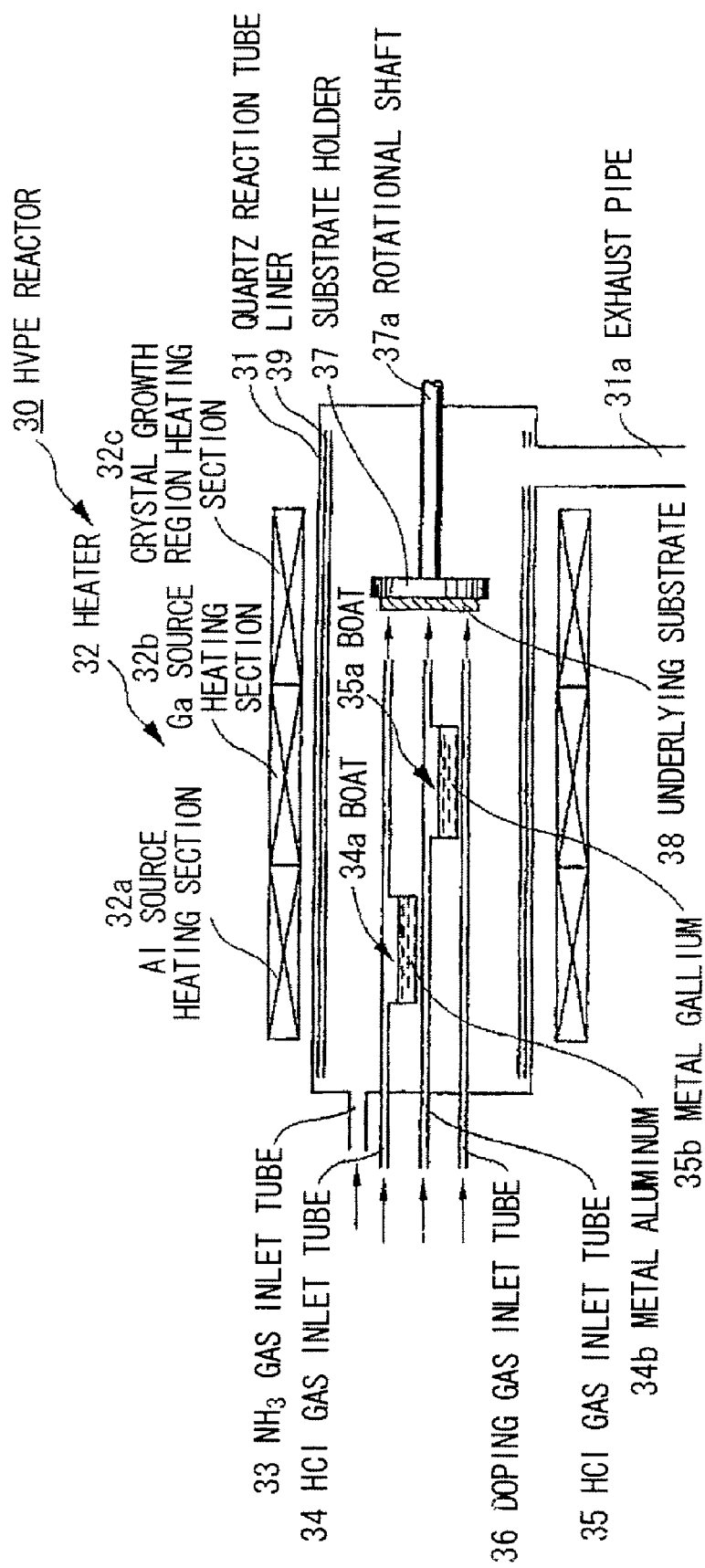
FIG. 3 is a schematic diagram showing an HVPE reactor to be used in the preferred embodiments of the invention.

FIG. 3 shows an example of HVPE reactor to be used in the embodiment.

The HVPE reactor 30 is of hot-wall type in which a heater 32 is disposed outside a quartz reaction tube 31 horizontally installed to heat the tube. On the left side (upstream side) of the quartz reaction tube 31, an $NH_3$ gas inlet tube 33 to introduce $NH_3$ gas as group V source, an HCl gas inlet tube 34 to introduce HCl gas to form $AlCl_3$ as group III source, an HCl gas inlet tube 35 to introduce HCl gas to form GaCl as group III source, and a doping gas inlet tube 36 to introduce dopant gas to control the conductivity type are provided. The HCl gas inlet tube 34 is made of alumina, and it is midway provided with a boat 34a of pyrolytic graphite (PG), in which metal aluminum 34b is accommodated. The HCl gas inlet tube 35 is made of quartz, and it is midway provided with a boat 35a of quartz, in which metal gallium 35b is accommodated.

On the right side (downstream side) of the quartz reaction tube 31, a substrate holder 37 for mounting an underlying substrate 38 thereon is supported by a rotational shaft 37a, around which the substrate holder 37 can be rotated.

The heater 32 comprises three zones of an Al source heating section 32a to heat a part corresponding to the boat 34a where the metal aluminum 34b is accommodated, a Ga source heating section 32b to heat a part corresponding to the boat 35a where the metal gallium 35b is accommodated, and a crystal growth region heating section 32c to heat a part corresponding to the underlying substrate 38.

On the inner wall of the quartz reaction tube 31, a liner 39 of pyrolytic boron nitride (PBN) is disposed to prevent the erosion of the quartz which may react with the Al source during the crystal growth, and to prevent the cracking of the reaction tube which may crack due to the difference in thermal expansion coefficient between the deposited material in the growth and the quartz during the cooling step of the reactor. An exhaust pipe 31a is disposed at an end of the quartz reaction tube 31 on the downstream side thereof.

Growth Method

A method of growing sequentially the GaN layer and the AlN layer on the underlying substrate 38 by using the HVPE reactor 30 will be explained below.

At first, the underlying substrate 38 of sapphire etc. is placed on the substrate holder 37, and the metal aluminum 34b and the metal gallium 35b are charged into the boats 34a and 35a, respectively. Then, the Al source heating section 32a and the Ga source heating section 32b are heated to 500° C. and 800° C., respectively, whereby the metal aluminum 34b and the metal gallium 35b are melted. The crystal growth region heating section 32c is heated to 1000° C. Then, $NH_3$ gas as group V source is introduced from the $NH_3$ gas inlet tube 33, and HCl gas to produce the group III source is introduced from the HCl gas inlet tube 35. Meanwhile, for the control of the reaction, the HCl gas and $NH_3$ gas as source gas are introduced mixed with a carrier gas such as $H_2$ gas.

In the HCl gas inlet tube 35, the HCl gas is midway contacted with the metal gallium 35b being melted to conduct a reaction: Ga+HCl→GaCl+(1/2)$H_2$, whereby GaCl gas is generated.

The mixed gas of the GaCl gas thus generated and the $H_2$ carrier gas and the mixed gas of the $NH_3$ and the $H_2$ carrier gas are carried in the direction of arrows (in FIG. 3) in the space of the quartz reaction tube 31. On the underlying substrate 38 placed on the substrate holder 37, a reaction: GaCl+ $NH_3$→GaN+HCl+$H_2$ is conducted, whereby the GaN is deposited on the underlying substrate 38. The gases introduced into the quartz reaction tube 31 are sent through the exhaust pipe 31a downstream to a detoxification facility, where they are detoxified by a treatment, and discharged in the air.

Meanwhile, a dopant can be doped into the GaN layer by introducing the dopant gas from the doping gas inlet tube 36 during the formation of the GaN layer.

Then, the NH$_3$ gas as group V source is introduced from the NH$_3$ gas inlet tube 33, and the HCl gas to produce the group III source is introduced from the HCl gas inlet tube 34. Meanwhile, for the control of the reaction, the HCl gas and NH$_3$ gas as source gas are introduced mixed with a carrier gas such as H$_2$ gas.

In the HCl gas inlet tube 34, the HCl gas is midway contacted with the metal aluminum 34b being melted to conduct a reaction: $Al+3HCl \rightarrow AlCl_3+(3/2)H_2$, whereby AlCl$_3$ gas is generated.

The mixed gas of the AlCl$_3$ gas thus generated and the H$_2$ carrier gas and the mixed gas of the NH$_3$ and the H$_2$ carrier gas are carried in the direction of arrows (in FIG. 3) in the space of the quartz reaction tube 31. On the underlying substrate 38 placed on the substrate holder 37, a reaction: $AlCl_3+NH_3 \rightarrow AlN+3HCl$ is conducted, whereby the AlN is deposited on the underlying substrate 38. The gases introduced into the quartz reaction tube 31 are sent through the exhaust pipe 31a downstream to a detoxification facility, where they are detoxified by a treatment, and discharged in the air.

Separation Method

After the GaN layer and the AlN layer are grown on the underlying substrate 38, the underlying substrate 38 is separated to provide the composite self-standing substrate 10 comprising the GaN layer 11 and the AlN layer 12 as shown in FIG. 1. The separation can be conducted by VAS (void-assisted separation) method. The VAS method is excellent in that it allows the separation of a large-diameter substrate with a good reproducibility, and that it allows the formation of a GaN-based self-standing substrate with a low dislocation density and uniform characteristics.

EFFECTS OF THE EMBODIMENT (1) AlN is more difficult to grow than GaN. Therefore, the AlN has many crystal defects and is low in crystalline quality. However, in this embodiment, since the ALN is epitaxially grown on the high-quality GaN crystal with few defects, the crystalline quality of the AlN can be enhanced due to that of the underlying GaN layer.

(2) The growth rate of AlN is difficult to increase without damaging the crystalline quality since AlN is more difficult to grow than GaN. However, in this embodiment, since the AlN only has to be grown on the surface of GaN grown at a high speed, the total growth time required can be shortened to improve the productivity significantly.

(3) Aluminum chloride as a source used to grow the AlN by HVPE may react with the quartz member composing the reactor depending on the growth conditions, and the quartz member may be eroded. However, in this embodiment, since the growth of the AlN is minimized, the erosion can be suppressed significantly.

(4) When the AlN is in a separate process formed on the GaN, native oxide film will be generated since the GaN is once exposed into the air, or the growth surface may be not clean due to a contamination during the handling. Further, since the GaN surface is subjected to a rising and falling temperature cycle, it may be denatured by heat. As a result, a number of cracks may be generated in the AlN crystal layer. However, in this embodiment, since the GaN layer and the AlN layer can be sequentially grown in the same reactor without changing the growth temperature significantly, the composite self-standing substrate can be obtained without cracks and with the GaN/AlN interface kept clean.

(5) In this embodiment, the AlN can be epitaxially grown on the GaN, like the epitaxial growth method on the GaN substrate which is practically used for the epitaxial growth of a device structure, since the thick GaN layer as a base is formed previously. Also, the conventional method for device fabrication process can be without change applied to the substrate of this embodiment. The cracking of the substrate will be prevented. Thus, a device structure can be easy formed on the AlN substrate with a good reproducibility.

(6) In this embodiment, the GaN layer at the back surface of the substrate can be removed after fabricating a device structure by using the developed lapping or grinding technique. As a result, the device structure can be formed as if it is fabricated on the AlN substrate with a good crystalline quality. Therefore, when the device structure is installed, heat generated from the device can be radiated through the substrate only with the AlN layer. The device characteristics can be significantly prevented from deteriorating due to the heat to enhance the reliability.

Example 1

By using a process as shown in FIG. 4A to 4F, the composite self-standing substrate 10 in FIG. 1 is fabricated.

First, on a C-face sapphire substrate 41 with a diameter of 2 inches, a Si-doped GaN layer 43 is grown 0.5 µm through a 20 nm thick low-temperature grown GaN buffer layer (not shown) by MOVPE (FIG. 4A). The growth conditions are atmospheric pressure, substrate temperature of 600° C. during the growth of the buffer layer, and substrate temperature of 1100° C. during the growth of the epi-layer. The group III source used is trimethylgallium (TMG), the group V source used is ammonium (NH$_3$), and the dopant is monosilane. The carrier gas is a mixed gas of hydrogen and nitrogen. The growth rate of the crystal is set to be 4 µm/h. The carrier concentration of the epi-layer is set to be $2 \times 10^{18}$ cm$^{-3}$.

Then, on the Si-doped GaN layer 43, a metal Ti film 45 is deposited 20 nm thick (FIG. 4B). The substrate thus obtained is placed in an electric oven, where it is thermally treated at 1050° C. for 20 min. in H$_2$ gas flow containing 20% of NH$_3$. As a result, a part of the GaN layer 43 is etched to generate a high-density void layer 46, and the Ti film 45 is nitrided into TiN layer 47 on the surface of which microscopic submicron holes are formed at high density (FIG. 4C).

Then, the substrate is placed in the HVPE reactor as shown in FIG. 3, where a GaN layer 48 is grown 400 µm thick by using a supply gas which contains a source gas of $9 \times 10^{-3}$ atm GaCl and $5.3 \times 10^2$ atm NH$_3$ in a carrier gas (FIG. 4D). The carrier gas used is N$_2$ gas containing 5% of H$_2$. The growth conditions of the GaN layer 48 are atmospheric pressure, and substrate temperature of 1000° C.

After the growth of GaN is completed, an AlN layer 49 is grown 150 µm thick by using a supply gas which contains a source gas of $2.2 \times 10^{-3}$ atm AlCl$_3$ and $4.8 \times 10^{-2}$ atm NH$_3$ in a carrier gas (FIG. 4D). The carrier gas is N$_2$ gas during the growth of the AlN layer 49.

After the growth of AlN is completed, the GaN layer 48 and the AlN layer 49 are automatically separated at the void layer 46 from the sapphire substrate 41 during the cooling process of the HVPE reactor. Thus, the composite self-standing substrate can be obtained.

The composite self-standing substrate obtained is slightly convex warped on the back side, and is formed slightly concave on the top side according to the warping on the back side (FIG. 4E). However, no significant defect such as a crack is observed.

Then, both surfaces of the composite self-standing substrate obtained are flattened on a metal plate by lapping with diamond slurry, and the composite self-standing substrate 10 can be formed. Further, the top surface is mirror-polished with finer diamond slurry. The amount of removal by the flattening is about 50 μm and about 70 μm on the top side and back side, respectively. After the flattening, in order to remove the process strain layer, the surfaces of the substrate are dry-etched to remove about 1 μm thereof (FIG. 4F).

The thickness of the substrate is measured 430±2 μm at any points thereof by a dial gauge. In the substrate thus obtained, the GaN layer 11 is 330 μm thick and the AlN layer 12 on the top side is 100 μm thick.

By (0001) diffraction of the AlN layer 12 at the top surface of the substrate, the half-value width of the X-ray rocking curve is measured 185 sec. In order to evaluate the dislocation density of the substrate, the Si-doped GaN layer is epitaxially grown 1 μm on AlN layer 12 by MOVPE and the density of dark spots on its surface is evaluated by cathode luminescence. As a result, the values are $4.4 \times 10^6$ $cm^{-2}$ at the center of the composite self-standing substrate 10 and $5.3 \times 10^6$ $cm^{-2}$ as an average of in-plane nine points.

Example 2

By using a process as shown in FIG. 5A to 5F, the composite self-standing substrate 20 in FIG. 2 is fabricated.

First, on a commercially available single-crystal C-face sapphire substrate 51 with an off angle of 0.25° in m-axis direction and with a diameter of 2.5 inches, an undoped GaN layer 53 is grown 300 nm by MOVPE (FIG. 5A). The growth conditions are atmospheric pressure, and substrate temperature of 1100° C. during the growth of the epi-layer. The group III source used is trimethylgallium (TMG), the group V source used is ammonium ($NH_3$), and the dopant is monosilane. The carrier gas is a mixed gas of hydrogen and nitrogen. The growth rate of the crystal is set to be 4 μm/h.

Then, on the undoped GaN layer 53, a metal Ti film 55 is deposited 25 nm thick (FIG. 5B). The substrate thus obtained is placed in the electric oven, where it is thermally treated at 1000° C. for 25 min. in $H_2$ gas flow containing 20' of $NH_3$. As a result, a part of the GaN layer 53 is etched to generate a high-density void layer 56, and the Ti film 55 is nitrided into TiN layer 57 on the surface of which microscopic submicron holes are formed at high density (FIG. 5C).

Then, the substrate is placed in the HVPE reactor as shown in FIG. 3, where a GaN layer 58 is grown 400 μm thick (FIG. 5D). The growth conditions of the GaN layer 58 are atmospheric pressure, and substrate temperature of 1040° C. The source gases are GaCl and $NH_3$. The carrier gas is nitrogen gas containing 5 of hydrogen at the initial stage of the growth, and the amount of hydrogen gas mixed is reduced gradually to zero from the time when the GaN is about 120 μm grown. The crystal growth rate in the HVPE is about 120 μm/h. From the time when the GaN is 400 μm grown, the amount of GaCl introduced in the reactor is reduced gradually and the amount of the $AlCl_3$ is increased gradually so that only $AlCl_3$ and $NH_3$ are supplied finally. During this process, the amount of $NH_3$ is not changed and the V/III ratio is kept to be 12 constantly. Thus, while an $Al_pGa_{1-p}N$ 59 is grown about 20 μm, the composition is continuously changed from GaN to AlN, and then an AlN layer 60 is further grown 150 μm (FIG. 5D).

After the growth of AlN is completed, the GaN layer 58, the $Al_9Ga_{1-p}N$ transition layer 59 and the AlN layer 60 are automatically separated at the void layer 56 from the sapphire substrate 51 during the cooling process of the HVPE reactor (FIG. 5E).

After the growth, on the surface of the AlN layer 60, no significant defect such as a crack is observed, and a clean morphology is provided to be evaluated a mirror surface by human eyes.

Then, the back surface of the composite self-standing substrate obtained is flattened by a grinding machine with diamond wheel, and, in order to remove the process strain layer, the back surface is slightly etched in a heated solution of potassium hydroxide. Further, the outer diameter of the substrate is shaped into φ50.8 mm by a chamfering machine. The top surface is flattened on a metal plate by lapping with diamond slurry, and is mirror-polished with finer diamond slurry. The amount of removal by the flattening is about 70 μm and about 100 μm on the top side and back side, respectively. Thus, the composite self-standing substrate 10 is obtained (FIG. 5F).

The thickness of the substrate is measured 400±2 μm at any points thereof by a dial gauge. In the substrate thus obtained, the GaN layer 21 is 300 μm thick, the $Al_pGa_{1-p}N$ layer 22 as the transition layer of AlGaN is 20 μm thick, and the AlN layer 23 on the top side is 80 μm thick.

By (0001) diffraction of the AlN layer 23 at the top surface of the substrate, the half-value width of the X-ray rocking curve is measured 195 sec. In order to evaluate the dislocation density of the substrate, the Si-doped GaN layer is epitaxially grown 1 μm on AlN layer 23 by MOVPE and the density of dark spots on its surface is evaluated by cathode luminescence. As a result, the values are $4.6 \times 10^6$ $cm^{-2}$ at the center of the composite self-standing substrate 20 and $5.0 \times 10^6$ $cm^{-2}$ as an average of in-plane nine points.

Example 3

On the composite self-standing substrate obtained in Example 2, a blue LED epitaxial layer is grown by low pressure MOVPE to fabricate a blue LED.

Figure 6:
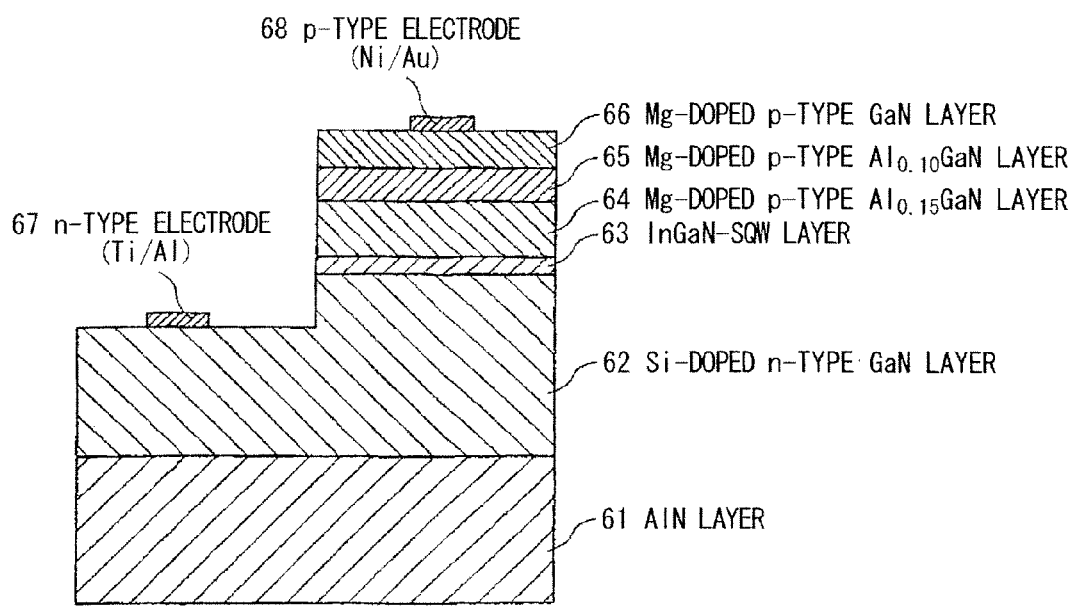
FIG. 6 is a schematic cross sectional view showing an LED in Example 3 according to the invention.

FIG. 6 shows the layer structure of the blue LED thus fabricated. The blue LED comprises, grown on the AlN layer 61 of the composite self-standing substrate as shown in FIG. 2, a Si-doped n-type GaN layer 62, an InGaN-SQW layer 63, a Mg-doped p-type $Al_{0.15}GaN$ layer 64, a Mg-doped p-type $Al_{0.10}GaN$ layer 65, and a Mg-doped p-type GaN layer 66. Electrode patterns are formed by photolithography. Then, the back surface of the composite self-standing substrate is ground by 330 μm by the grinding machine to have only the AlN layer 61 with a thickness of 70 μm at the bottom. Further, the LED epitaxial wafer is diced into 1 mm×1 mm. An n-type electrode 67 of Ti/Al is formed on the Si-doped n-type GaN layer 62, and a p-type electrode 68 of Ni/Au is formed on the Mg-doped p-type GaN layer 66.

The chip is mounted on an Al stem by using Ag paste. In measurement, emission output obtained is as high as 25 mW when feeding 50 mA current. The lifetime of the LED in accelerated test is assumed longer than 20000 hours.

Comparative Example

Figure 7:
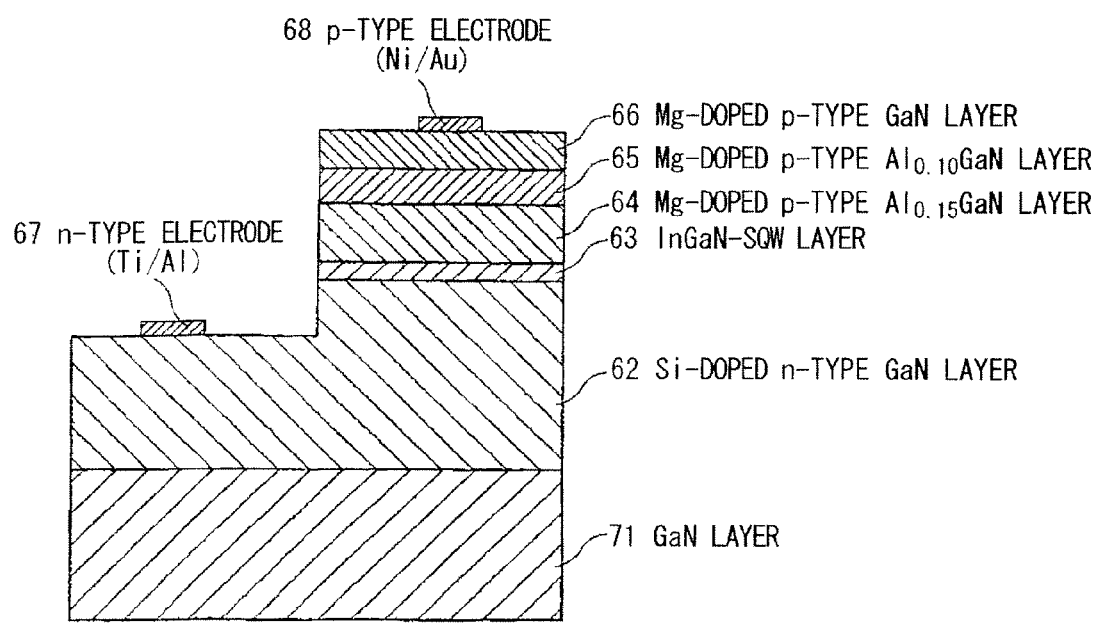
FIG. 7 is a schematic cross sectional view showing an LED in Comparative Example.

FIG. 7 shows the layer structure of a blue LED in Comparative Example. The blue LED comprises, grown on the GaN self-standing substrate that only a GaN layer 71 is grown by using the same method as in Example 2, the blue LED epitaxial layer as formed in Example 3.

In measurement conducted as in Example 3, emission output obtained is as low as 19 mW when feeding 50 mA current.

In the accelerated test, two of ten LED's rapidly deteriorated after few hours from the start of the test and turned off. The other eight LED's showed a drive-voltage rise of 16' in average after 120 hours.

Accordingly, it is confirmed that the heat radiation property to radiate heat from the device can be significantly improved by using the AlN layer, whereby the emission output and reliability of a high-output LED can be improved.

Example 4

Figure 8:
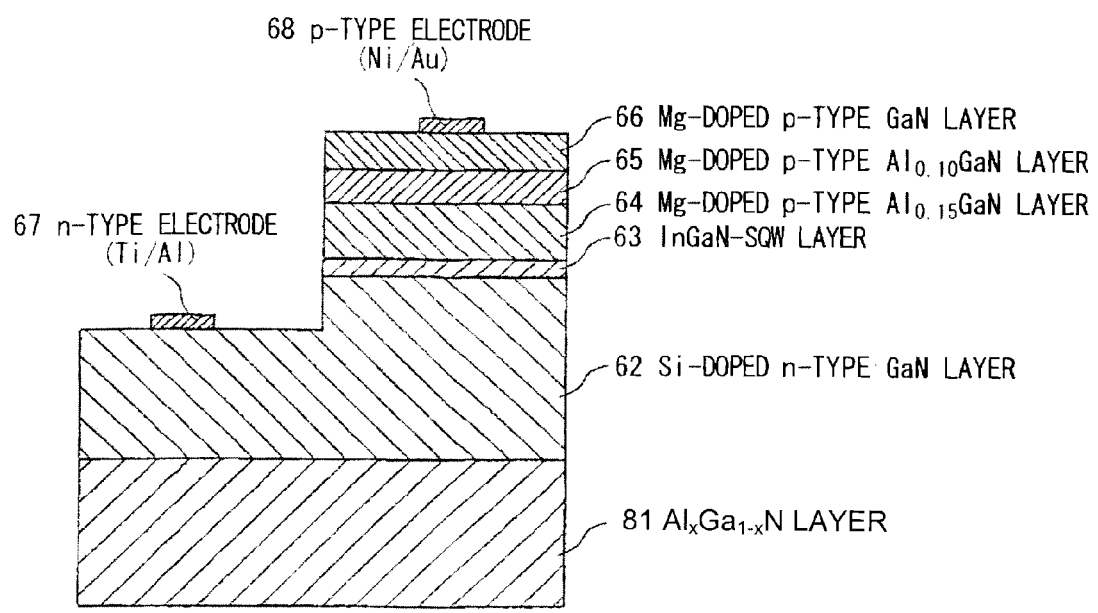
FIG. 8 is a schematic cross sectional view showing an LED in Example 4 according to the invention.

On the composite self-standing substrate obtained in Example 1, a blue LED epitaxial layer can be grown by low pressure MOVPE to fabricate a blue LED. FIG. 8 shows an example of the layer structure of a blue LED thus fabricated. As discussed herein, an AlGaN layer may be used instead of the AlN layer 12 of Example 1, an example of which is shown in FIG. 1, with the composition of the AlGaN layer being $Al_xGa_{1-x}N$ ($0.9 \leq x \leq 1$), including AlN.

The blue LED includes, for example, grown on an $Al_xGa_{1-x}N$ ($0.9 < x \leq 1$) layer 81 of the composite self-standing substrate, a Si-doped n-type GaN layer 62, an InGaN-SQW layer 63, a Mg-doped p-type $Al_{0.15}GaN$ layer 64, a Mg-doped p-type $Al_{0.10}GaN$ layer 65, and a Mg-doped p-type GaN layer 66. Electrode patterns are formed by photolithography. Then, the back surface of the composite self-standing substrate is ground by 330 µm by the grinding machine to have only the $Al_xGa_{1-x}N$ ($0.9 < x \leq 1$) layer 81 with a thickness of 70 µm at the bottom. Further, the LED epitaxial wafer is diced into 1 mm×1 mm. An n-type electrode 67 of Ti/Al is formed on the Si-doped n-type GaN layer 62, and a p-type electrode 68 of Ni/Au is formed on the Mg-doped p-type GaN layer 66.

Other Embodiments

Although the AlN is grown by HVPE in the above embodiments or Examples, it can be grown by MOVPE as separate process.

At the initial or middle step of the crystal growth, the known ELO method using a $SiO_2$ mask etc. may be used which allows the generation of a number of uneven parts on the crystal growth interface.

Although the sapphire substrate is used as the underlying substrate in the above embodiments or Examples, the other substrates, which are reported as a GaN-based epitaxial layer growth substrate, such as GaAs, Si, $ZrB_2$, ZnO etc. can be all used similarly.

Although the undoped substrate is exemplified in the above embodiments or Examples, the composite self-standing substrate may be doped with a suitable dopant such as Si, Mg, Fe, S, O, Zn, Ni, Cr, Se etc.

Although the AlN layer grown on the GaN layer is exemplified in the above embodiments or Examples, the AlN layer may be grown on an AlGaN layer instead of the GaN layer.

In modification, a self-standing substrate comprising InGaN, or a self-standing substrate with a multilayer structure comprising GaN, AlGaN, InGaN can be fabricated.

Although the invention is applied to the group III-V nitride-based semiconductor self-standing substrate, it can be applied to a group III-V nitride-based epitaxial substrate (template) with hetero-underlying substrate such as sapphire.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method of making a group III-V nitride-based semiconductor device, comprising:
   growing a group III-V nitride-based semiconductor film on a hetero-substrate and then depositing a metal film thereon;
   heating the hetero-substrate with the metal film in an atmosphere containing hydrogen gas or hydride gas to form a void in the group III-V nitride-based semiconductor film;
   growing a first layer comprising a GaN single crystal on the metal film by HVPE;
   continuously growing a second layer on the first layer in a same reactor by the HVPE, the second layer comprising a group III-V nitride-based semiconductor single crystal represented by $Al_xGa_{1-x}N$, where $0.9 < x \leq 1$, wherein the second layer has a thickness of 50 µm or more;
   removing the hetero-substrate while leaving the first layer and the second layer to provide a group III-V nitride-based semiconductor substrate, wherein the group III-V nitride-based semiconductor substrate is a self-standing substrate;
   flattening a top surface and a back surface of the group III-V nitride-based semiconductor substrate;
   forming a device structure comprising an epitaxial growth layer on the group III-V nitride-based semiconductor substrate; and
   flattening the back surface of the group III-V nitride-based semiconductor substrate to remove the first layer to render the second layer exposed, such that the group III-V nitride-based semiconductor device is formed such that the device structure is formed on the second layer.

2. A method of making a group III-V nitride-based semiconductor device, comprising:
   growing a group III-V nitride-based semiconductor film on a hetero-substrate and then depositing a metal film thereon;
   heating the hetero-substrate with the metal film in an atmosphere containing hydrogen gas or hydride gas to form a void in the group III-V nitride-based semiconductor film;
   growing a first layer comprising GaN single crystal on the metal film;
   continuously growing a second layer on the first layer in a same reactor, the second layer comprising group III-V nitride-based semiconductor single crystal represented by $Al_xGa_{1-x}N$, where $0.9 < x \leq 1$, wherein the second layer has a thickness of 50 µm or more, to provide a group III-V nitride-based semiconductor substrate;
   flattening a top surface and a back surface of the group III-V nitride-based semiconductor substrate;
   removing the hetero-substrate while leaving the first layer and the second layer to provide a group III-V nitride-based semiconductor self-standing substrate having a circular form with a diameter of 50 mm or more and a thickness of 200 µm or more;
   forming a device structure comprising an epitaxial growth layer on the group III-V nitride-based semiconductor substrate; and
   flattening the back surface of the group III-V nitride-based semiconductor substrate to remove the first layer to render the second layer exposed, such that the group III-V nitride-based semiconductor device is formed such that the device structure is formed on the second layer.

* * * * *